United States Patent [19]
Mori et al.

[11] Patent Number: 5,482,471
[45] Date of Patent: Jan. 9, 1996

[54] SOCKET APPARATUS FOR IC PACKAGE TESTING

[75] Inventors: Ikuo Mori, Ohizumi; Kiyokazu Ikeya, Sunto, both of Japan

[73] Assignee: Texas Instruments Incorporated, Dallas, Tex.

[21] Appl. No.: 197,437

[22] Filed: Feb. 16, 1994

[30] Foreign Application Priority Data

Feb. 24, 1993 [JP] Japan .................................. 5-060906

[51] Int. Cl.⁶ .................................................. H01R 13/15
[52] U.S. Cl. ........................................ 439/263; 439/331
[58] Field of Search .................................. 439/259–270, 439/330, 331, 72, 73, 68

[56] References Cited

U.S. PATENT DOCUMENTS

| | | | |
|---|---|---|---|
| 4,406,505 | 9/1983 | Aranovich | 439/438 |
| 4,715,826 | 12/1987 | Collier et al. | 439/438 |
| 4,750,891 | 6/1988 | Egawa | 439/259 |
| 4,846,704 | 7/1989 | Ikeya | 439/72 |
| 5,017,152 | 5/1991 | Matsuoka | 439/263 |
| 5,123,855 | 6/1992 | Petersen | 439/263 |
| 5,147,213 | 9/1992 | Funk et al. | 329/266 |
| 5,213,531 | 5/1993 | Matsuoka et al. | 439/331 |
| 5,290,192 | 3/1994 | Espenshade et al. | 439/331 |
| 5,320,550 | 6/1994 | Uratsuji et al. | 439/330 |

FOREIGN PATENT DOCUMENTS 0146280  6/1985  European Pat. Off. .

OTHER PUBLICATIONS

Patent Abstracts of Japan, vol. 9, No. 19 (E–292) (1742) 25 Jan. 1985 & JP–A–59 165 442 (Yamaichi Denki Kogyo K.K.).

Primary Examiner—Larry I. Schwartz
Assistant Examiner—Hien D. Vu
Attorney, Agent, or Firm—Russell E. Baumann; Richard L. Donaldson; Reneé E. Grossman

[57] ABSTRACT

A socket for testing integrated circuit (IC) packages (100) has a lower block (10) with a plurality of contact elements (11) movable between open and closed positions mounted therein, an upper block (20) fixed on the lower bock (10) and formed with a lead insertion hole (21) for the insertion of each lead (101) of the IC package (100), a cover member (30) adapted for vertical, up and down movement relative to the upper block (20), and a spring biased slide block (40) mounted to slidably reciprocate in a recess formed between the upper and lower blocks (10,20) in a direction which crosses, at approximately a right angle, the direction in which a lead (101) of an IC package (100) would be inserted into an opened contact element (11). The slide block (40) has a plurality of apertures (41) for opening and closing contact elements (11) upon movement of the cover member (30) by the use of a contact part opening and closing element (50) converting movement of the cover (30) to sliding action of the slide block (40).

8 Claims, 10 Drawing Sheets

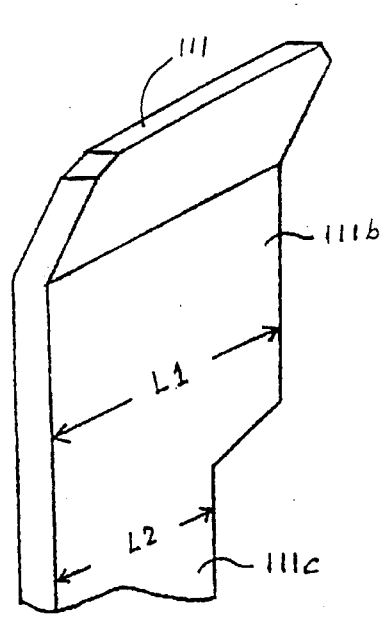
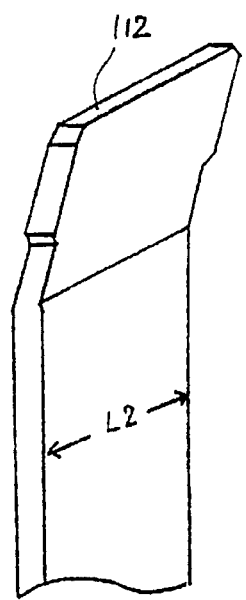
FIG. 11c.  FIG. 11d.
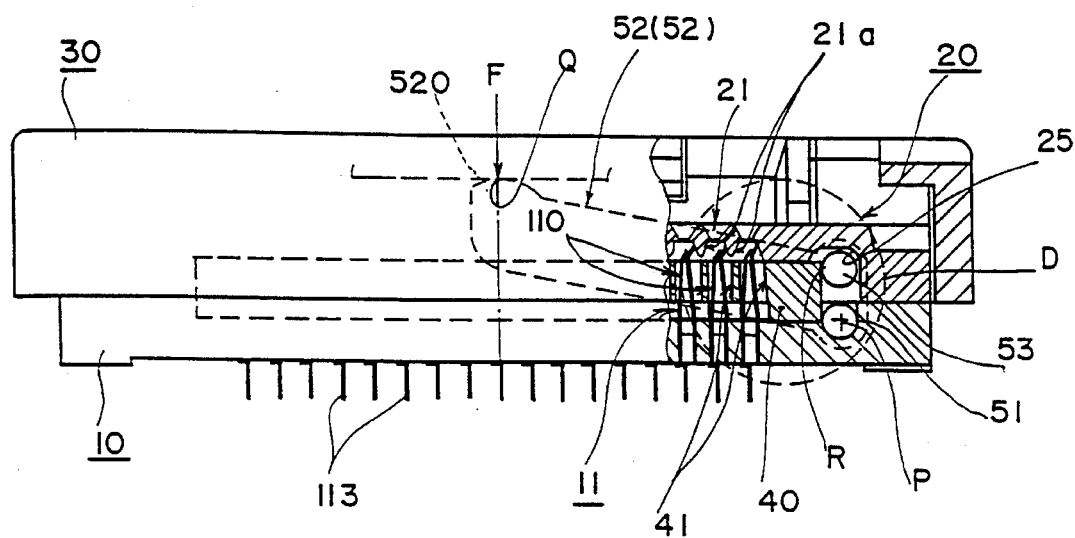
FIG. 12.

SOCKET APPARATUS FOR IC PACKAGE TESTING

BACKGROUND OF THE INVENTION

FIELD OF THE INVENTION

This invention relates generally to a socket adapted to receive an IC package (semiconductor integrated circuit package) for conducting selected burn-in tests and the like of the IC package.

DESCRIPTION OF RELATED ART

In connection with a heat resistance test, a so called burn-in test, or the like of IC packages such as PGA (Pin Grid Array), the IC package is loaded on a circuit substrate (printed substrate) through a socket and then put into a heating furnace for testing its suitability.

Sockets for testing of an IC package, as described above, having structures described in FIGS. 1 and 2 are known. This prior art socket is generally constructed having a lower base 1 on which a plurality of contact elements 2, corresponding to the IC leads, are disposed both on the upper and lower surfaces, an upper body 3 which has been assembled in such a way as to slide in a direction indicated by arrow 3d shown on the lower base 1 and a lever 4 coupled to upper body 3 and operable to cause sliding movement of upper body 3.

Lead insertion holes 3a for the IC leads are formed through the upper body 3 corresponding to the various contact elements 2. Lever 4 is configured approximately in the shape of an L with one of the legs 4a serving as a base supported on the lower base 1 and the other leg serving as handle part 4b extending from one side of the lower base 1.

At the center of base 4a an offset part 4c is formed for engaging and transmitting a force to the upper body 3 in the direction of movement. Part 4c is offset a distance d relative to the longitudinal axis of the base 4a and its offset part is inserted into a groove 3b of the upper body 3. The central part of the upper body 3 is recessed on its top surface forming a rectangular window for reception of an IC package to be loaded therein.

The IC package to be loaded in the test socket shown in FIGS. 1 and 2 is a PGA, to cite as an example, as shown in Figs. 3a and 3b, with a plurality of leads 101 extending out of the bottom of the resin-sealed main body 100 along the sides thereof.

If the handle part 4b of the lever 4 is rotated in a direction indicated by arrow 4d in FIG. 2 after the IC package has been placed in the opening of the upper body 3 and its leads 101 have been inserted into respective insertion holes 3a of the upper body 3 in the prior art structure, the upper body 3 is engaged and biased by the offset part 4c of the lever 4 and, along with its rotary movement, it moves to the left as indicated by arrow 3d in FIG. 2. On the inner surface of the upper body 3 corresponding to the contact parts 2a of each contact element 2, a pair of wedge-shaped protrusions 5 are formed (FIGS. 4a, 4b).

When the upper body 3 moves in a direction indicated by arrow 3d in FIG. 2, the wedge-shaped protrusions 5 move from the position indicated in FIG. 4a to the position indicated in FIG. 4b. When the wedge-shaped protrusions 5 move, the contact parts 2a of the contact element 2 move from the open state as shown in FIG. 4a along the wedge-shaped inclined surfaces. Upon the completion of the movement of the upper body 3, the contact parts 2a are held by the apex of the wedge-shaped protrusions 5 as shown in FIG. 4b and the contact parts 2a are closed in engagement with the IC lead 101 which has been inserted between the two contact parts 2a.

Handle part 4b of the lever 4 is then engaged with a hook 3c which protrudes from the side of the upper body 3 to lock the contact parts 2a in the closed position.

In connection with the removal of the IC package on the completion of the test, if the handle part 4b of the lever 4 is pulled out from under hook 3c and returned to its original position, the upper body 3 is returned to the original position by means of offset part 4c engaging the opposite side of groove 3b. Concomitantly, the wedge-shaped protrusions 5 are returned from the positions shown in FIG. 4b to the positions indicated in 4a. Because of this, the contact parts 2a of each contact element 2 is opened enabling removal of the IC package from above the upper body 3.

According to the prior art socket for the IC package test the upper body is reciprocated by the rotary operation of the lever that extends from the side of the socket as described above, thereby effecting the opening and closing of the contact parts of the contact elements by the reciprocating movement of the upper body. However, the construction of the device and the operating procedures for automating the rotary operation of the lever become complicated where automatic mounting and removal of the IC package are to be carried out by an automatic loading head.

Consequently, the complete automation of the mounting and removal of the IC package are not easily accomplished and are, in fact, difficult to achieve. In view of the fact that automation of the rotary operation of the lever cannot easily be carried out, manual operation has been relied on which causes an additional problem in that the correct positioning of the IC leads become difficult to achieve.

SUMMARY OF THE INVENTION

An object of the present invention is the provision of a socket for reception of an IC package, capable of easily and accurately positioning the IC leads and capable of realizing automatic mounting and removal of the IC package in a simple and easy manner.

Another object of the invention is the provision of apparatus effecting an accurate electrical connection, irrespective of the surface state of the IC leads that have been inserted between the contact parts.

Various additional objects and advantages of the present invention will become apparent from the following detailed description and accompanying drawings.

Briefly in accordance with the invention, a socket comprises a plurality of contact elements fixed to a lower block, an upper block fixed to the lower block, the upper block provided with lead insertion holes for the insertion of leads of the IC package at a location corresponding to the location of the contact elements, a cover member disposed over and movable vertically relative to the upper block, a slide block mounted to slide in reciprocation in a recess formed between the upper and lower blocks in a direction which crosses the direction in which a lead would be inserted in the opening of the contact elements, a plurality of apertures formed in the slide block for opening and closing each of the contact elements in dependence upon the sliding block location at such locations as will correspond to each of the contact elements and a contact element opening and closing mechanism that transmits the vertical movement of the cover member to the slide block. Each lead of the IC package that has been loaded on the upper block is inserted into a respective opened contact element and held at the contact element when the contact element is closed by the movement of the slide block.

According to a feature of the invention, a contact part of each contact element is bifurcated forming two contact pieces, the first contact piece is engaged by a respective shoulder or stop surface of the lead insertion hole of the upper block and, when the cover member is in its raised position, the second contact piece is engaged with either the first contact piece or a lead of an IC if one has been inserted between the contact pieces, and the second contact piece is displaced away from the first contact piece by engagement with an edge surface in the slide block aperture when the cover is depressed and the respective slide block aperture moves in that direction by the sliding of the slide block. In this manner, the contact part of each contact element is opened.

According to another feature of the invention, a contact element opening and closing mechanism is formed by a lever arm which has been freely, rotatably mounted with its axis of rotation extending in a direction at a right angle with the direction of movement of the slide block. The cover member is movably supported on a guide portion of the upper block and a motion transfer member is provided at a location which has been offset from the axis of rotation of the lever arm. The motion transfer member engages and moves the slide block in one direction by the rotation of the lever arm in one direction and a return force causes rotation of the lever arm in the opposite direction. The vertical movement of the cover is converted into a straight line sliding movement of the slide block through the opening and closing mechanism and, at the same time, the contact part is opened or closed by the sliding action.

The base end of the lever arm is journaled on the lower block by means of a first shaft and, at the same time, a second shaft is supported at a location which has been offset from the first shaft on the base end of the lever arm, the slide block is engaged and moved in an opening direction by the rotation of the second shaft about the first shaft as the lever body makes a rotation in one direction and the opening force is released by the rotary return of the lever arm and the second shaft in another direction.

According to another feature of the invention, the length between the journaling axis of the lever arm and the point of engagement with the cover member, expressed by a, and the length between the journaling axis and the action point of the motion transfer member, expressed by b, has a relation between a and b of a>>b. , that is, a is significantly larger than b.

According to yet another feature of the invention, the shape of the two contact pieces of the contact element is formed in such a manner that a least one of the contact pieces engages the IC lead at an edge portion thereof in a manner to pierce or bite through the surface of the lead.

When a force is applied to the cover member to push it down, the force is transmitted to the slide block through the contact element opening and closing mechanism causing the slide block to slide in one direction in opposition to a spring member and to the spring force exerted by the contact pieces engaged with surfaces defining respective slide block apertures. Thereupon, the contact part of each contact element is opened in dependence upon the movement of the slide block apertures in which the contact parts are received. When, after the opening of the contact parts, the IC package is loaded and positioned on the upper block by using an automatic loading head or the like, leads received in respective lead insertion holes of the upper block are then received between the opened respective contact parts. When the push-down force on the cover member is released, the slide block returns as a result of the return force of the spring as well as the individual contact pieces acting on the surfaces of the slide block apertures.

When the slide block is returned, the contact elements are allowed to close by the return movement of the slide block apertures, with a result that the IC leads that have been inserted therebetween are each held by two contact pieces. In this manner, the IC leads are accurately and satisfactorily engaged with the contact elements.

When the downwardly directed force on the cover member is removed a return force is exerted on the cover member through the bias of the spring and the individual contact pieces biasing the surfaces of the slide block apertures transmitted through the contact parts opening and closing mechanism and is pushed up to a prescribed location in dependence upon the return movement of the slide block and is held at the said location. In this manner, the IC package is mounted on the socket for testing.

In order to remove the IC package, it is only necessary to push down the cover in the same manner as described above, thereby causing the slide block to slide in the first direction and, after the contact parts of each contact element have been opened, take out the IC package from above the upper block.

The mounting and removal of the IC package can be simply carried out by applying a downward force on the cover member and then removing the force. This can be realized simply and accurately by means of an automatic unit. In addition, the loading of the IC package on the upper block and the removal thereof from the upper block can be carried out easily by means of an automatic loading head such as a vacuum absorption head, to cite an example. Therefore, the automatic mounting of the IC package in the socket for test purposes and removal therefrom can be easily carried out.

Where length a is set sufficiently large relative to b, that is, a >> b, the force required at the action point of the lever arm is reduced. Accordingly, the vertical force required for the cover member to cause the slide block to reciprocally slide is reduced, thereby opening and closing the contact parts of each contact element that has been engaged in the said aperture.

In the event that the surface of the IC lead is coated with an oxide film which could interfere with electrical engagement, the contact piece of the contact element made in accordance with the invention engages the lead surface by penetrating the coated film. Accordingly, satisfactory electrical continuity is maintained at all times, irrespective of the surface condition of the IC lead.

BRIEF DESCRIPTION OF THE DRAWINGS

FIGS. 11(c) and 11(d) are perspective views of a portion of respective contact pieces of a contact element;

FIG. 12 is a front view partially in cross section showing the IC package mounting arrangement of a socket made in accordance with the invention with the contact elements closed and with no IC package mounted therein;

DESCRIPTION OF THE PREFERRED EMBODIMENTS

Figure 6:
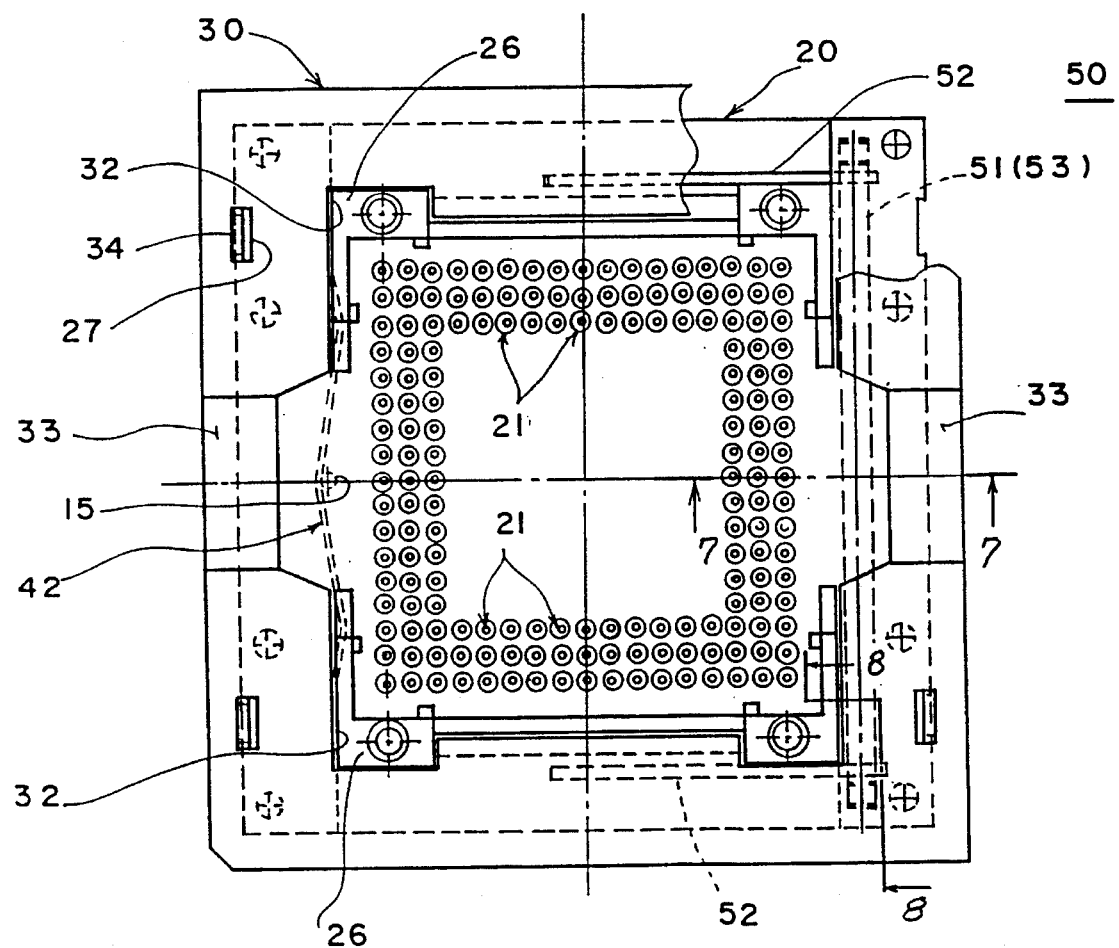
FIG. 6 is a plan view, partly broken away, showing a socket for IC package testing according to the present invention.

FIGS. 6 through 17 show a socket for IC package testing made in accordance with the present invention. The socket is formed with a lower block 10 and an upper block 20 fixed to block 10 with a plurality of contact elements 11 mounted in block 10 extending through both upper and lower surfaces of block 10 in an arrangement that corresponds to the arrangement of leads 101 of an IC package. Lead insertion holes 21 are formed in upper block 20 into which respective leads 101 of IC package 100 are received for electrical engagement with contact elements 11. A cover member 30 is disposed on upper block 20 in such a manner as to be capable of being pushed down and pushed up on outer guide surfaces of upper block 20. A slide block 40 is slidably disposed in a recess formed between upper and lower blocks 10, 20 in such a manner as to reciprocate in a direction parallel to the horizontal surfaces 22, 12 (FIG. 7) of the upper and lower blocks 10 and 20, that is, in the direction generally perpendicular to the direction in which leads of an IC would be inserted in the opening of the contact elements 11. A continuous spring force in the return direction is placed on slide block 40 by a spring 42 (FIG. 6). A plurality of apertures 41 are formed in slide block 40 for the reception and engagement of the contact parts of the contact elements 11. Contact parts opening and closing mechanism 50 transmits the downwardly exerted force on the cover member 30 to the slide block 40, causes the slide block 40 to slide in one direction in opposition to the spring force of spring 42 and opens the contact parts of the contact elements 11 by engaging an enlarged portion of each contact part by an edge surface of a wall defining aperture 41 with the movement of the said aperture 41. When the downwardly exerted force of the cover member 30 is removed the spring force moves the slide block in the opposite, return direction thereby allowing the closing of the contact parts of the contact elements 11.

The upper and lower blocks 10 and 20, cover member 30 and the slide block 40 may conveniently be formed by molding a suitable polymeric material.

Contact element 11 is formed from a metallic, electrically conductive terminal member. Its contact part 110 is bifurcated to form two contact pieces 111 and 112. Contact terminal 113 is formed extending downwardly from contact part 110 through lower block 10. Contact terminal 113 is connected in a conventional manner, as by soldering, to a circuit pattern on a substrate used in mounting the socket (not shown in the drawings).

The hollow or recessed portion between surfaces 12 and 22 is formed approximately in the shape of a parallelepiped, with one end wall of lower block 10 forming the recess being cut out. A groove 13 is formed in the top surface of block 10 in the vicinity of the cut-out wall for the insertion of a first shaft 51 of the contact parts opening and closing mechanism. Groove 13 extends parallel to the end of the block having the cut-out wall. In addition, on both sides adjacent to that end of block 10, grooves 14 extend perpendicular to and in communication with groove 13 and are provided for receiving the lever arms 52 of the contact parts opening and closing mechanism 50.

An upwardly extending pin 15 is mounted at the center of the opposite end of lower block 10 within the recess. The central portion of spring 42 is inserted between this pin and the wall surface defining the opposite end of the recessed portion.

Spring 42 is formed from suitable sheet spring material and its opposite distal end portions extend forwardly into the recess with both distal end portions engaging and placing a bias on slide block 40 received in the recess.

Slide block 40 is capable of sliding with a reciprocating motion having a prescribed stroke between first and second ends of the recess. While moving toward spring 42 and the first end, slide block 40 receives a return force by spring 42 for a return movement toward the second end.

Contact part 110 of each contact element 11 is inserted into a corresponding aperture 41 of the slide block 40. The tip portion of contact pieces 111 extend above the upper surface of the slide block 40. In addition, the tip portions of the contact pieces 112 extend upwardly out of apertures 41 to a greater extent than the tip portions of contact pieces 111. The tip portions of contact pieces 112 that extend above the upper surface of the slide block 40 are engaged with the shoulder or stop surface of wall 21a that defines lead insertion holes 21 on the lower surface of the upper block 20 in the state of being elastically deformed in the direction of closing of the contact part 110.

Figure 9:
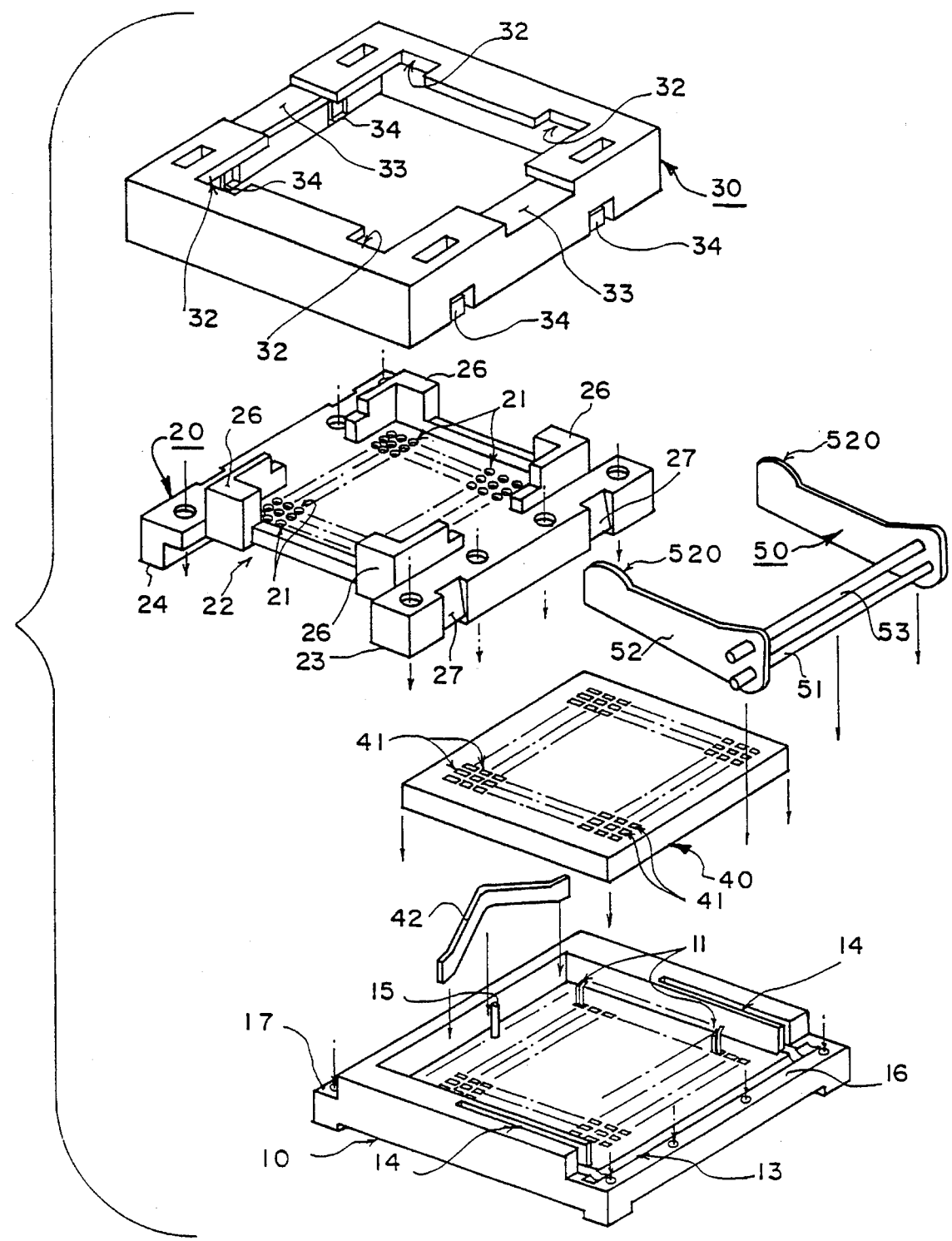
FIG. 9 is a blown-apart perspective view of a socket made in accordance with the invention as shown in FIG. 6.
Figure 9A:
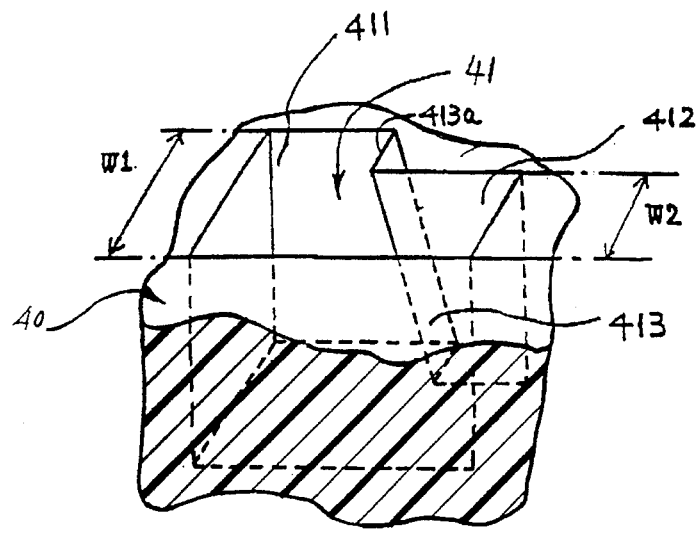
FIG. 9(a) is an enlarged broken-away perspective view of a portion of a slide block showing details of a contact part receiving aperture.

As seen in FIG. 9(a), aperture 41 is formed generally in a "L" configuration having an aperture portion 411 with a width W1 at one end joined to an aperture portion 412 with a smaller width W2 at the opposite end through a laterally extending wall 413. Wall 413 is inclined with the plan view area of aperture portion 411 increasing as one goes from the top surface of block 40 to its bottom surface.

With reference to FIGS. 11(c) and 11(d), each contact piece 111 has a portion 111b having a width L1 and a portion 111c having a width L2, less than L1. Contact piece 112 has a substantially uniform width L2 so that portion 111b extends laterally beyond contact piece 112. Contact pieces 111, 112 are received in respective portions 411, 412 of apertures 41 with portion 111b disposed in the enlarged portion of the aperture defined by wall 413. Widths W1, W2 of aperture 41 are slightly greater than respective widths L1, L2 of the contact pieces.

When cover member 30 is in the raised position each free end of contact pieces 112 is resiliently engaged with shoulder 21a of a respective lead insertion hole 21 with each contact piece 112 positioned in portion 412. Each free end of contact pieces 111b is resiliently engaged with either an IC lead received between the contact pieces or the opposite surface of a respective contact piece 112 with each contact piece 111 positioned in portion 411.

Figure 7:
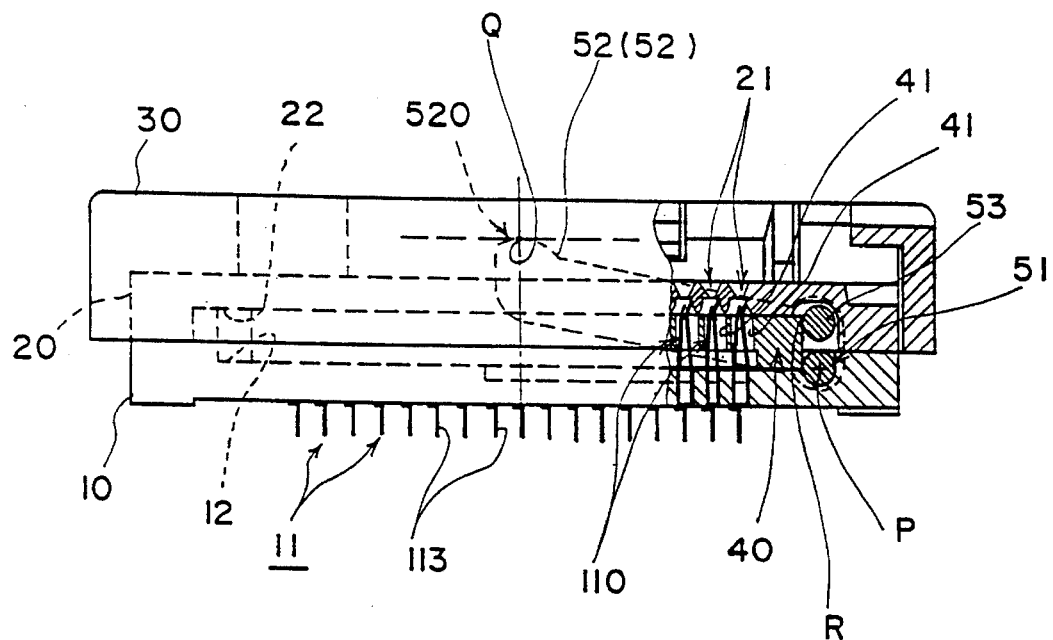
FIG. 7 is a front view of the FIG. 6 socket, with a partial cross section taken on line 7—7 in FIG. 6.
Figure 8:
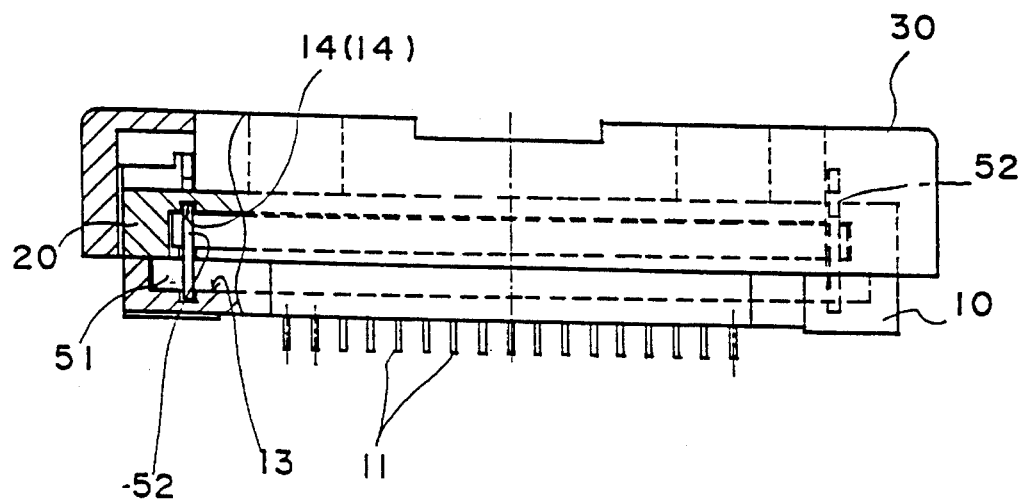
FIG. 8 is a side view of the FIG. 6 socket, with a partial cross section taken on line 8—8 in FIG. 6.

When cover member 30 is depressed, slide block 40 slides to the left as seen in FIGS. 7 and 9(a) with laterally extending edge 413a of slide block 40 engaging contact piece portion 111b and moving contact piece 111 away from contact piece 112.

Figures 11A, 11B:
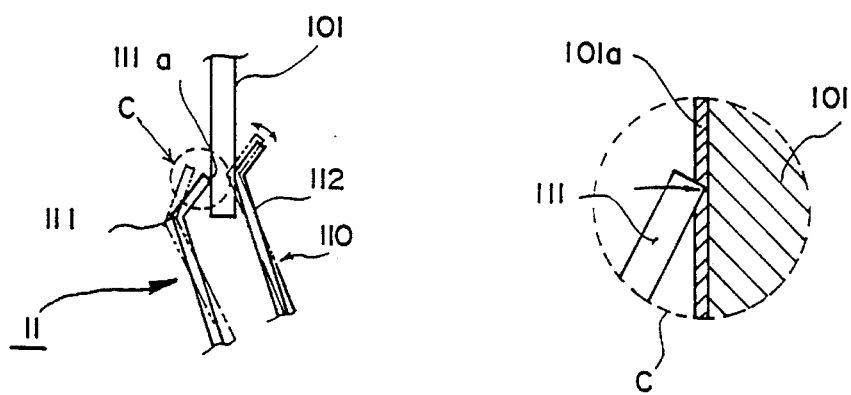
FIG. 11(a) is a partial front view showing the state of engagement between the contact element of a socket made in accordance with the invention and an IC lead.
FIG. 11(b) is an enlarged view of portion C of FIG. 11(a)

With reference to FIG. 11(a), the two contact pieces 111 and 112 of the contact part 110 are bent approximately in the shape of an L facing the same direction (to the right as shown in the Figure). According to this contact construction, even if there should be some positional deviation between lead 101 and contact part 110 in connection with the insertion of IC lead 101 between two contact pieces 111 and 112 when contact part 110 is open as shown in FIG. 11(a), the IC lead 101 will be received into contact part 110 along the bent inclined surface of contact piece 112. Accordingly, it becomes possible to accurately introduce IC lead 101 that has been inserted through the lead insertion hole 21 of the upper block 20 between the two contact pieces 111 and 112 of the corresponding contact part 110.

As stated above, the two contact pieces 111 and 112 of the contact part 110 are bent approximately in the shape of an L. Contact piece 111, in particular, is bent so that the edge of the distal end extends toward IC lead 101 that is inserted as is shown in FIG. 11(b), with a result that, if IC lead 101 is received in contact part 110 when the contact part 110 is open as is shown in FIG. 11(a), contact piece 111 comes into contact with IC lead 101 at the edge part 111a at the tip, with a result that it will engage and pierce the surface of lead 101. Because of this, even in the case where a layer of an oxide film 101a is formed on the surface of IC lead 101 as is shown in FIG. 11(b) and where the coated film 101a would interfere with electrical engagement, the edge part 111a of contact piece 111 breaks through the layer of the coated film 101a, thereby biting or piercing the lead surface to provide a satisfactory and accurate electrical engagement.

Upper block 20 is formed in the shape of a flat block. Lead holes 21 for the insertion of leads 101 of an IC package 100 are formed therethrough as described above. Wall part 23 at one end and the wall part 24 at the other end of surface 22 defining the recess (see FIG. 9) are received on respective step parts 16 and 17 that are formed on opposite ends of the lower block 10 and are respectively secured to the step parts 16 and 17 using conventional fasteners, such as screws. A groove 25 (see FIG. 12) for receiving the second shaft 53 of the contact parts opening and closing mechanism 50 is formed in the inner surface of the upper block 20 in communication with the recess and in parallel with the end wall part 23. Groove 25 is also parallel with groove 13 formed in the upper surface of lower block 10 and is aligned above and in communication with it.

Guide frames 26 extend upwardly from the top surface of block 20 at the four outer corners of the array of lead insertion holes 21. Guide frames 26 serve to guide a cover member 30 for vertical movement up and down and for maintaining its selected positional orientation without vibration. Each frame 26 is formed approximately in the shape of an L and the four corners of the main body 100a of the IC package 100 are positioned on the inner surface of each L shape of guide frames 26.

In other words, the main body part 100a of the IC package 100 that has been loaded on upper block 20 is positioned and guided by the respective inner surface of guide frames 26 that have been formed at four locations on the upper surface of upper block 20 to be accurately placed on upper block 20. In this manner, each of the leads 101 is accurately placed into its respective lead insertion hole 21. Accordingly, guide frames 26 serve to guide cover member 30 and, at the same time, position the IC package 100 as it is loaded on upper block 20.

Cover member 30 that has been placed on upper block 20 is approximately in the shape of a window, rectangular in form. The portion that receives the IC package is cut out approximately in the shape of a rectangle 31 with a guide groove 32 provided at the four corners of the opened part 31 adapted to receive guide frames 26. At the center of the two opposite ends there is a recessed portion 33 formed for placing a finger to facilitate a manual press-down operation.

When cover member 30 has been pressed down to a certain position, the lower portion of its top wall engages the upper surface of upper block 20 to limit downward movement. In addition, hooks 34 are formed at two locations on the lower part of both end walls of the cover member 30 and, when the cover member 30 has been pushed up, they are engaged with the step portions 27 that have been provided at two locations on the lower part of the upper block 20 respectively, with the upward movement above that being limited.

The opening and closing mechanism 50 comprises a first shaft 51 which is placed into groove 13 at one end of lower block 10, a pair of lever arms 52 are attached to opposite ends of shaft 51 and are respectively received in grooves 14 provided at both sides and extending from one end of lower block 10. A second shaft 53 is also connected between the base end of lever arms 52 in parallel relation to shaft 51 and spaced therefrom by a selected distance. The second shaft 53 serves as a motion transfer member as will be described below.

Figure 10:
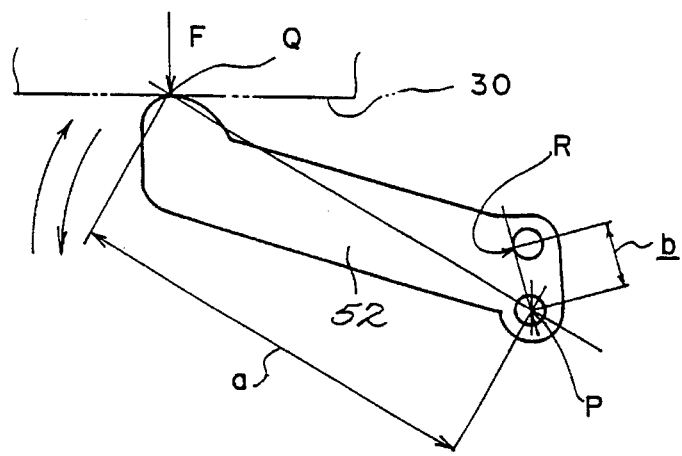
FIG. 10 is a schematic diagram for the purpose of explaining the principle governing the action of the contacts part opening and closing mechanism of a socket made in accordance with the invention.

The lever arms 52 rotate counterclockwise as seen in FIG. 10 with the first shaft 51 as the center of rotation in response to the vertical motion of the cover member 30. The tips 520 of the lever arms 52 extend upwardly in a generally convex curved surface. The lower faces of both sides of the cover member 30 are placed on each tip 520 of lever arms 52. The cover member 30 is flexibly supported in a floating state by the lever arms 52.

The second shaft 53 receives at its outer surface a return force due to the bias of spring 42 that has been transmitted through slide block 40 and is continuously biased tending to rotate around the first shaft 51 in the return direction.

As a result of the biasing force that is transmitted to the second shaft 53 from spring 42, the lever arms 52 at the right and at the left sides are maintained in a state tending to rotate clockwise as seen in FIG. 10 with the first shaft 51 as the center of rotation. The cover member 30 is flexibly supported at an elevated position pushed up by the tip part 520 of the lever arms 52 at the right and at the left side and is maintained at this position. It is in this position when the push-down force on the cover member 30 has been removed and no downward force is being applied.

FIG. 10 is a figure showing the operating principle governing the contacts part opening and closing mechanism according to this embodiment. Where the distance (length) between the pivot P of the lever arm 52 or the central axial line P of the first shaft 51 and the action point Q of the downward vertical force F due to the push-down of the cover member 30 upon tip 520 of the lever arms 52 is expressed by a and where the distance (length) between the central axial line P of the first shaft 51 and the action point R of the motion transfer force of the second shaft 53 upon the slide block 40 or, in other words, the return force that the second shaft 53 receives from the slide block 40 is expressed by b, length a is selected to be significantly larger compared with b or a >> b.

If the dimensional relationship between a and b is set at a/b being large in this manner, it becomes possible to reduce the required downwardly directed press-down force on the cover member 30. Accordingly, it becomes possible to push-down the cover member 30 with a small force F. Along with this, it becomes possible to smoothly rotate the lever arms 52 and cause the slide block 40 to smoothly slide in one direction.

Further, when the cover member 30 is pushed up it can be engaged in a smooth return action. Because of the smooth push-up and push-down actions, the opening and closing action of the contact part 110 of each contact element 11 can be carried out accurately by using a small force.

In this embodiment, a pair of lever arms 52 of the opening and closing mechanism 50 have been arranged on both sides of the slide block 40. However, it is within the purview of the invention to employ a lever arm 52 arranged only on one side of the slide block 40, provided that the flexible support of the cover member and its push-down and push-up actions are carried out accurately and smooth. Both arrangements are intended to be included in the scope of this invention.

Figure 1:
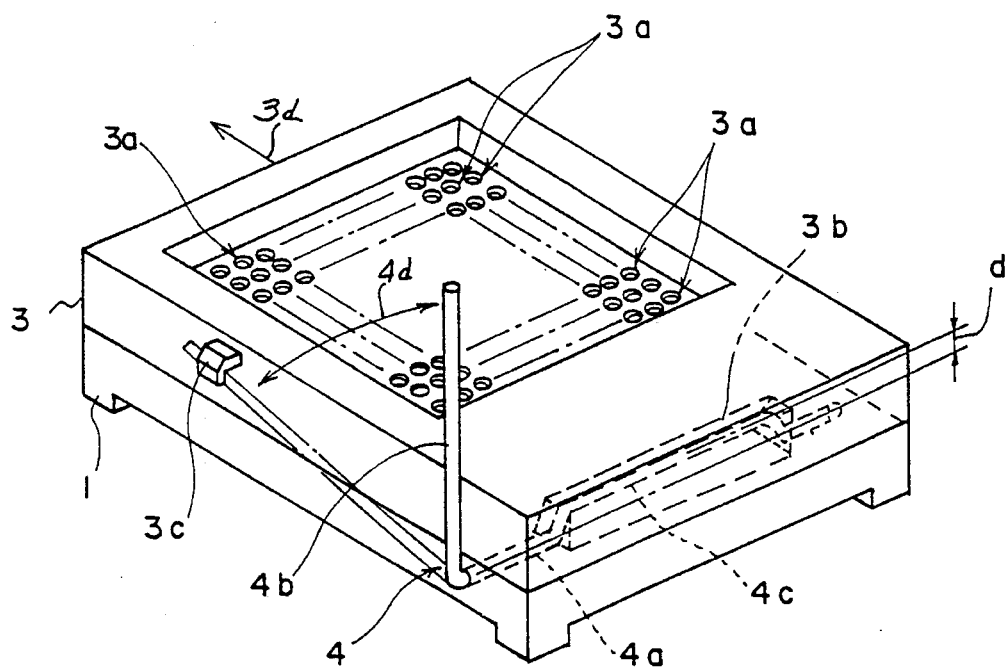
FIG. 1 is a perspective view of a prior art socket.
Figure 2:
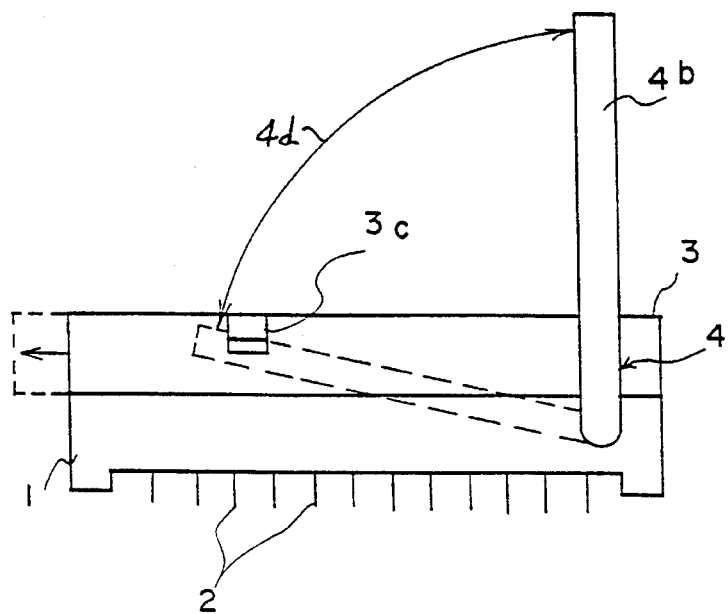
FIG. 2 is a side view of the socket shown in FIG. 1.
Figure 3A:
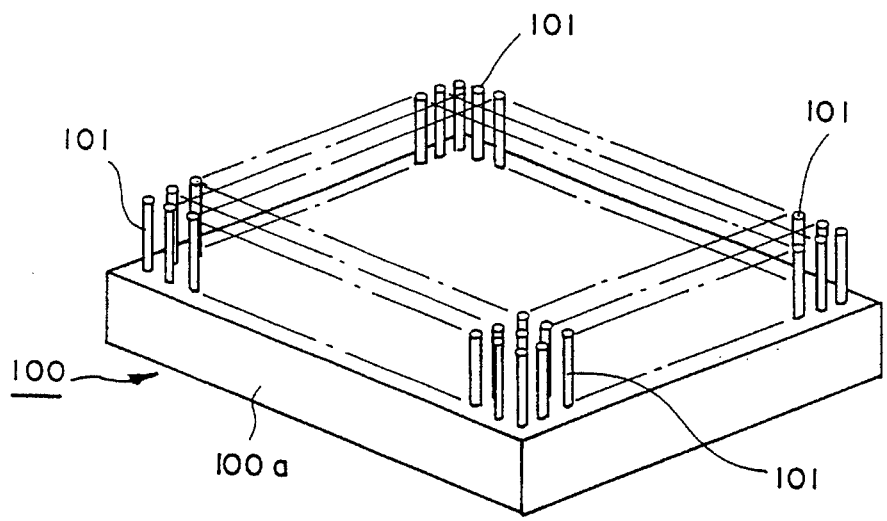
FIG. 3(a) is a perspective view showing an example of an IC package which may be tested using a socket as shown in FIGS. 1 and 2.
Figure 3B:
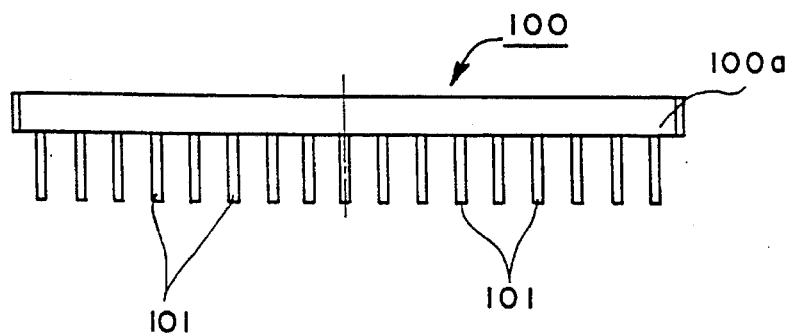
FIG. 3(b) is a front view of the FIG. 3(a) IC package.
Figures 4A, 4B:
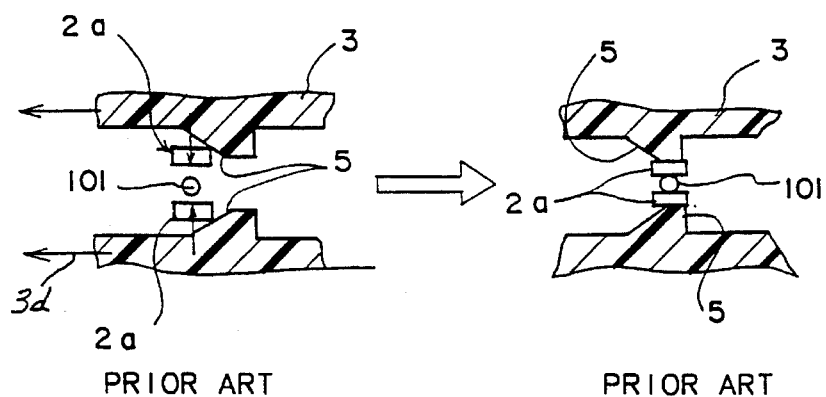
FIGS. 4(a) and 4(b) are partial cross sections shown for the purpose of explaining the contact part opening and closing action of a socket made in accordance with the prior art.
Figure 5A:
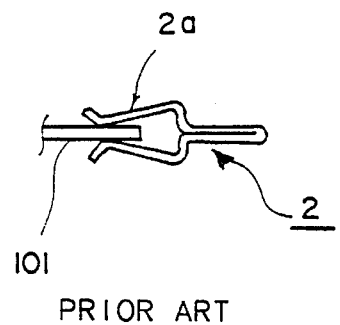
FIGS. 5(a) and 5(b) are partial side view shown for the purpose of explaining the contact part opening and closing action of a socket made in accordance with the prior art.
Figure 5B:
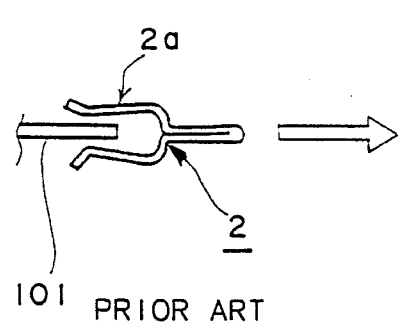

IC package 100, which is to be tested using the socket made in accordance with the invention, is constructed as a PGA as shown in FIGS. 3a and 3b, to cite as an example. However, it goes without saying that the invention is not limited to the PGA array but rather can be used for the other kinds of IC packages as well. In such cases, appropriate changes would be effected in the contact element array and associated structure but this can be easily realized within the scope of the invention.

When IC package 100 is not being loaded and the cover member 30 is not being pressed down, as is shown in FIG. 12, the cover member 30 is flexibly held at the furthermost elevated position by the upward return force of the lever arms 52 at the right and left sides. In addition, slide block 40 has returned to the right side end of FIG. 12 by the spring force of spring 42 and the individual contact pieces 111. Along with this, the contact pieces 111 and 112 of the contact part 110 of each contact element 11 have the gap between them closed as is shown in FIG. 13.

Figure 13:
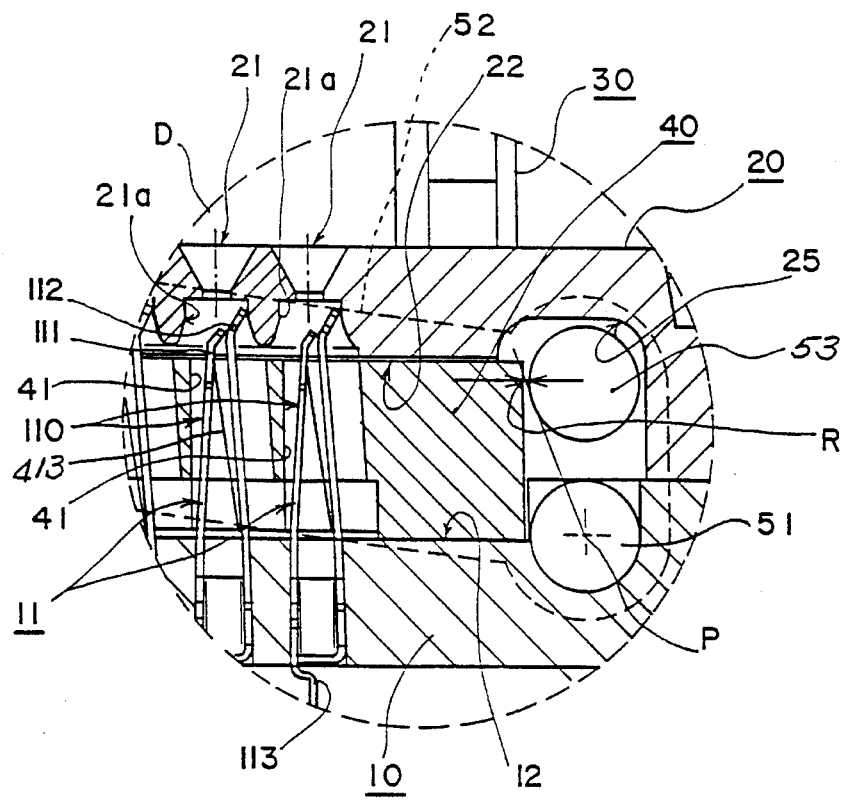
FIG. 13 is an enlarged view of portion D of FIG. 12.

From the state shown in FIGS. 12 and 13, the lever arms 52 at the right and left side rotate counterclockwise downwardly with the first shaft 51 as the center of rotation when both sides of the cover member 30 are pushed down by the action of the head or the like of an IC automatic loader. When the lever arms 52 rotate downwardly, the second shaft 53 moves concomitantly. When the second shaft 53 rotates about shaft 51, it moves the slide block 40 in a first direction (towards the left of the figure). Because of this biasing force, the slide block 40 slides in the first direction in opposition to the spring force of the spring 42 and contact pieces 111.

When the slide block 40 moves in the first direction, laterally extending edge 413a of a respective slide block aperture 41 moves the contact piece portion 111b of the contact part 110 of each of the contact elements 11 in the direction of opening the contact part 110. That is, when cover member 30 is depressed, slide block 40 is moved against the force of spring 42 and the contact pieces 111 are moved to the open position because the projecting portions 111b are forced to move by the laterally extending edges 413a of the apertures 41. Contact pieces 112, on the other hand, remain in their original position regardless of the position of slide block 40.

Figure 14:
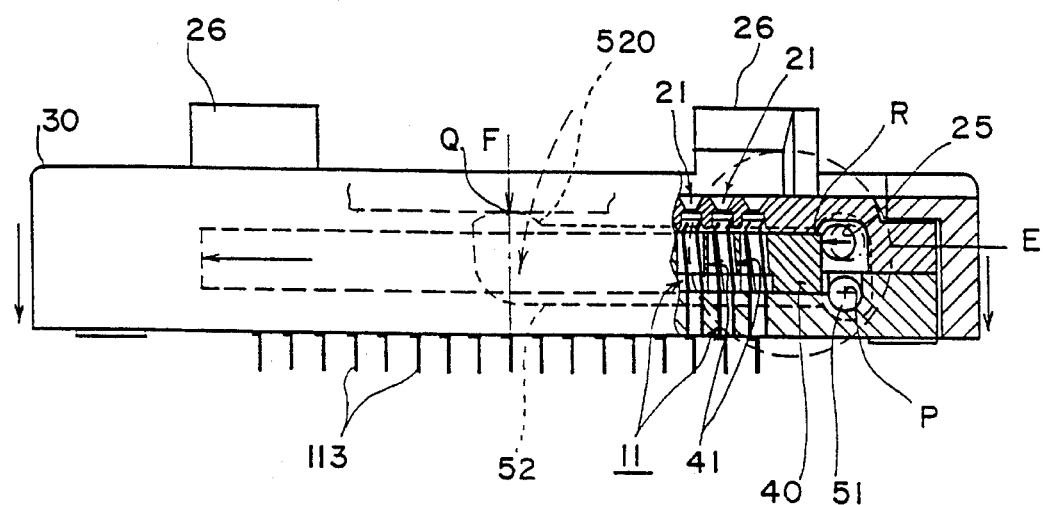
FIG. 14 is a view similar to FIG. 12 but shown with the contact elements opened.
Figure 15:
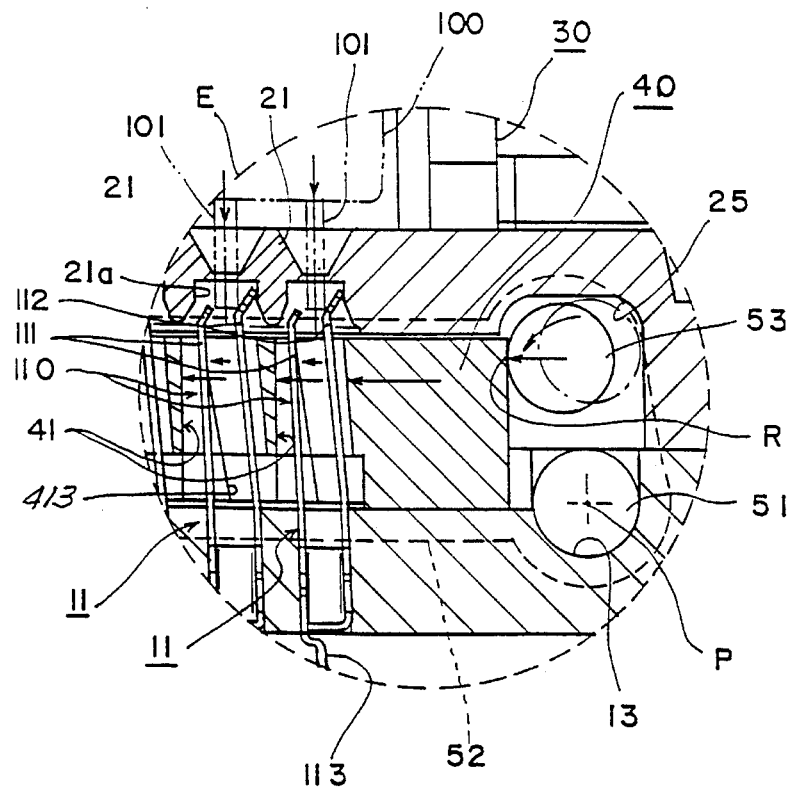
FIG. 15 is an enlarged view of portion E of FIG. 14 and with a portion of an IC package shown in dashed lines about to be mounted in the socket.
Figure 16:
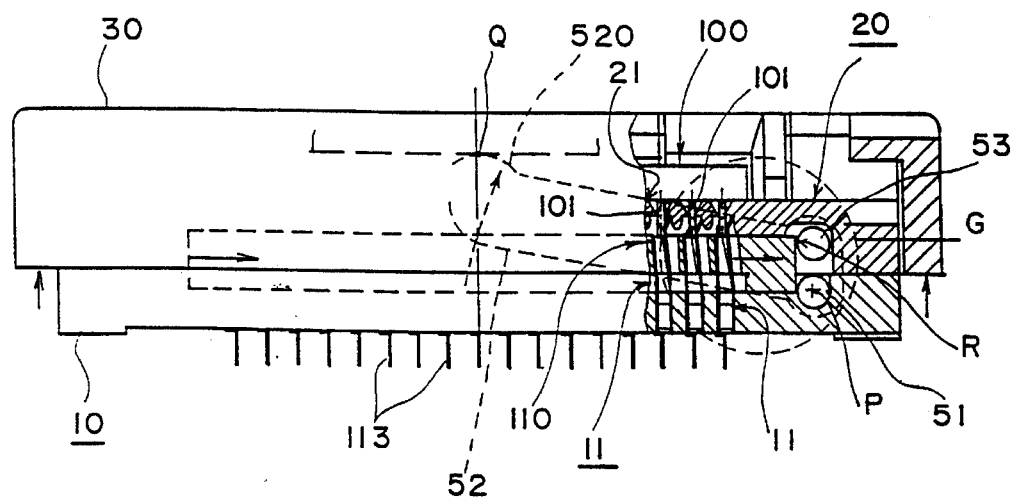
FIG. 16 is a view similar to FIGS. 12 and 14 but shown with an IC package mounted in the socket and the contact elements closed.

When the cover member 30 is pushed down to its extremity as is shown in FIGS. 14 and 15, its upper surface is positioned by the upper surface of the upper block 20. In addition, the lever arms 52 rotate until they have entered grooves 14 and the second shaft 53 rotates around the first shaft 51. Because of this, the slide block 40 slides to the end of the first direction as is shown in FIG. 15. Along with this, the gap between the contact pieces 111 and 112 of the contact part 110 of each contact element 11 is opened by the movement of contact piece 111 by means of laterally extending edge 413a.

In this position, the IC package 100 is loaded on the upper block 20 of the socket by means of the automatic loading head (not shown in the drawing) when the contact part 110 of each of the contact elements 11 are fully opened. Thereupon, the IC package 100 is guided and regulated by the guiding frames 26 of the upper block 20 and correctly positioned on the upper surface of the upper block. Its leads 101 are inserted between respective contact pieces 111 and 112 of the corresponding contact parts 110 through lead insertion holes 21 of the upper block 20.

When, after the IC package 100 has been correctly loaded on the upper block 20, the downward push-down force on the cover member 30 is removed, the force that depressed the lever arms 52 is removed and the lever arms 52 return upwardly rotating about shaft 51 by the return force of the spring 42 and each contact piece 111 that is transmitted to the second shaft 53 through the slide block 40. In linkage with this rotary return of the lever arms 52, the second shaft 53 rotates back to the original position shown in FIG. 13 around the shaft 51. The removal of the biasing force transmitted through shaft 53 against the slide block 40 allows slide block 40 to slide back to the right side of FIG. 14.

Figure 17:
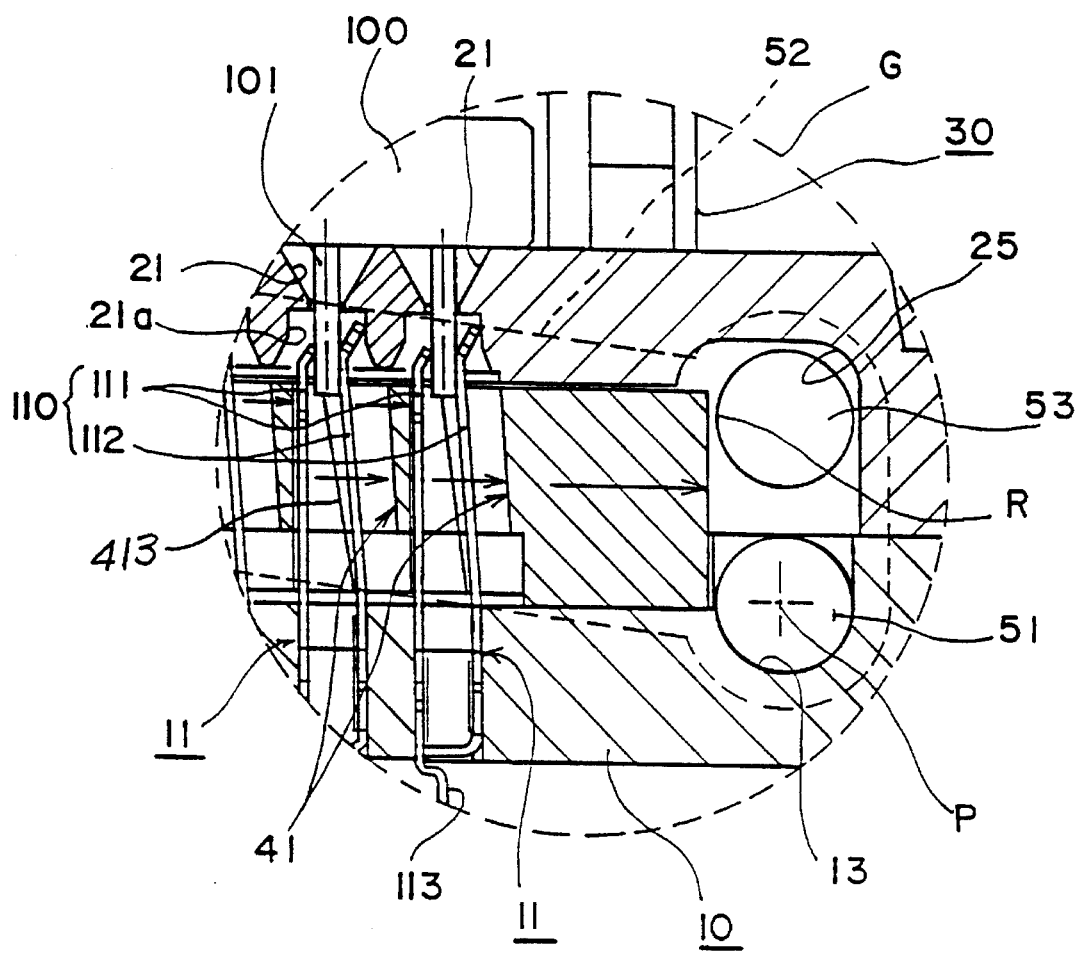
FIG. 17 is an enlarged view of portion G of FIG. 16.

When the slide block 40 slides back to the right end, the contact part 110 of each contact element 11 is closed due to the movement of contact pieces 111 in the closing direction as is shown in FIG. 17. The two contact pieces 111 and 112 of each contact part 110 are biased against the surface of IC lead 101 as shown in FIG. 11a and in FIG. 17. Because of this, each lead 101 of the IC package 100 is connected to the corresponding contact element 11 in a state of satisfactory electrical engagement. Thereafter, the test of the IC package 100 is carried out.

In connection with the removal of the IC package 100 from the socket after the completion of the test of the IC package 100, if the cover member 30 is pressed down in accordance with the operational procedure similar to that described above, contact part 110 of each contact element 11 is opened in the same manner as described above, with a result that the pressing and holding of the IC leads 101 by the contact parts 110 are released.

Because of this, it is possible for the IC package 100 to be easily lifted out from upper block 20. Therefore, it is only necessary to remove the IC package 100 from the socket by means of the IC loading head.

It will be seen that as a result of the invention:

(1) The application and release of the downward vertical force on cover member 30 and the accompanying opening and closing operation of each contact element can be easily realized by using an automatic unit. Accordingly, the automatic mounting of the IC package for the socket for testing and its removal, and the automation of the operating procedures ranging from the mounting to the removal can be easily realized.

(2) The dimensional relationship of length a between the pivot of the lever arm of the contact parts opening and closing mechanism and the action point of the pushdown by the cover member and the length a between the pivot of the lever arm and the action point of the motion transfer member (second shaft) is selected to be large, a>> b; to thereby minimize the force required to depress the cover member and optimize the smoothness of the sliding motion of the slide block by a small biasing force of the contact parts opening and closing mechanism, thereby ensuring the smooth and accurate opening and closing of the contact parts of each contact element with a small force.

(3) The contact pieces of each contact element are bent in a preselected shape, with a result that when the contact part is closed one of the contact pieces engages the IC lead in a piercing manner at the edge part, with a consequence that, even in a case where an oxide film is formed on the surface of the IC lead to obstruct electric continuity, the contact piece of the contact part breaks open the oxide film and makes a contact with the surface of the IC package lead. Accordingly, a satisfactory and accurate electrical engagement can be achieved at all times irrespective of the state of the lead surface.

(4) In as much as the contact part of a contact element is held in an open state immediately below the lead insertion hole of the upper block and moreover, the two contact pieces of the contact part are bent in such a shape as will be suitable for the introduction of the IC lead that has entered the lead insertion hole, the positioning of the lead can be carried out simply, easily and accurately by merely positioning and loading the IC package on the upper block and inserting the lead thereof into respective insertion holes.

Although the invention has been described with respect to a specific preferred embodiment thereof, many variations and modifications will become apparent to those skilled in the art. It is the intent that the appended claims be interpreted as broadly as possible in view of the prior art to include all such variations and modifications.

What is claimed:

1. A socket comprising a lower block having a top surface and a plurality of contact elements mounting thereon, each contact element having a contact part comprising first and second elongated contact pieces extending upwardly from the top surface for receiving an IC lead of an IC package, an upper block having a top and bottom surface mounted on the lower block and having IC lead insertion holes extending between the top and bottom surfaces of the upper block and aligned with respective contact elements, a recess being formed between the upper and lower blocks, a slide block slidably mounted in the recess and movable between first and second extremities, the slide block having a top and bottom surface and having an array of apertures extending between top and bottom surfaces corresponding to the contact elements, the slide block having first and second ends, a spring member disposed in the lower block placing a force on the slide block urging the slide block toward one of the extremities and a contact opening and closing mechanism formed by a ever positioned opposite said spring member having a base portion which has been journaled along an axid freely rotatable in the socket, the lever having a lever arm extending from the past portion and having a free distal end, a cover member being supported on the free distal end, the lever base portion being journaled on the lower block by means of a first shaft, a second shaft being supported at a location which has been offset for the first shaft on the lever base portion, the slide block being engaged and moved in one direction toward the other extremity by a force transmitted through the rotation of the second shaft about the first shaft as the lever base portion makes a rotation in said one direction and the force is removed by the rotary return of the lever base portion and the second shaft in an opposite direction toward said one extremity, the vertical movement of the cover member being converted into a straight line sliding action of the slide block, one of the contact pieces of each contact part having a distal free end and in engagement with a surface of the upper block, the other contact piece biased toward the one contact piece when the slide block is at the one extremity, and being displaced from the one contact piece when the slide block is at the other extremity.

2. A socket according to claim 1, wherein a length between the axis and the free distal end of the lever arm which engages the cover member is expressed by a and a length between the axis and the engagement portion is expressed by b, the relationship between a and b is selected to b a>>b, with a significantly larger than b.

3. A socket according to claim 1 in which the two contact pieces of each contact part includes a sharp edge portion which engages an outer layer of an IC lead received between the contact pieces to thereby pierce the outer layer.

4. A socket comprising upper and lower blocks fixed to one another and forming a recess between the upper and lower blocks, the recess having first and second ends, a slide block having a top and bottom surface disposed in the recess and being reciprocally solvable on its bottom surface between an extremity at the first end and an extremity at the second end, a plurality of contact elements mounted in the lower block, each contact element having a terminal portion extending downwardly form the lower block and having a contact part extending about the lower block into the recess, the slide block formed with a plurality of apertures extending through the slide block from the top to the bottom surface, an aperture provided for each contact part, said contact part of each contact element is bifurcated into first and second contact pieces, the first contact piece having a distal end portion contiguous to a sidewall of a lead insertion hole, the slide block apertures each formed with an extending edge means on a wall thereof, the second contact piece being engageable with the edge means of an aperture when the slide block is at the second end and out of engagement with the edge means when the slide block is at the first end, a spring disposed in the recess placing a bias on the slide block urging the slide block toward the first end, a plurality of lead insertion holes, each having a sidewall, formed through the upper block and being in communication with the recess, a lead insertion hole being aligned with each respective contact element, the lead insertion holes and contact elements being arranged to be in alignment with leads of an integrated circuit package, the contact part of each contact element being received in a respective aperture of the slide block and having a distal end portion contiguous to the sidewall of a respective lead insertion hole, a cover member formed with an integrated package receiving window disposed on the upper block and vertically movable thereon between an upper position and a lower position, and motion transfer means mounted din the socket to transfer vertical movement of the cover member to sliding movement of the slide block, the cover member being in the lower position when the slide block is at the second end and the cover member being in the upper position when the slide block is at the first end said motion transfer means comprises a lever having first and second level arms, the lever arms having a base end coupled to a first shaft rotatably mounted on the lower block adjacent the first end of the recess and a motion transfer member engageable with the slide block to apply a bias to the slide block to move the slide block against the bias of the spring when the lever is rotated in a selected direction, the lever arms having a free distal end portion engageable with the cover member, downward movement of the cove member causing the lever arms to pivot in the selected direction, an integrated circuit package having leads depending therefrom being receivable in the window of the cover member with the leads received in respective lead insertion holes, the contact parts of the contact elements being in an open position when the sliding block is at the second end to receive and release respective leads and the contact parts of the contact elements being in a closed position when the slide block is at the first end in engagement with leads received in the contact parts.

5. A socked comprising a lower block in which a plurality of contact elements each having a contact part bifurcated into first and second contact pieces movable between opened and closed position, are mounted in such a way as to be opened allowing an IC lead of an IC package loaded on the socket to be inserted in a first direction into a contract part of a respective contact element or closed with the IC lead electrically connected to the contact part, an upper block fixed on the low block, the upper block having lead insertion holes for the insertion of respective leads of an IC package formed therethrough in alignment with respective contact elements, a cover member vertically movable up and down relative to the upper block received on the upper block, a slide block mounted in said lower block to slide in reciprocating motion in a direction which crosses the first direction and in which a plurality of apertures are formed through the slide block at such location as will correspond to each of the contact elements, each contact element received in an aperture, a spring member disposed in the lower block placing a force on the slide block and a lever positioned opposite said spring member having a base portion which has been journaled along an axis freely rotatable in the socket, the lever having a leer arm extending from the base portion and having a free distal end, the cover member being supported on the free distal end, the lever base portion being journaled on the lower block by means of a first shaft, a second shaft being supported at a location which has been offset from the first shaft on the lever base portion, the slide block being engaged and moved in one direction against said spring by a force transmitted through the rotation of the second shaft about the first shaft as the lever base portion makes a rotation in one direction and the force is removed by the rotary return of the lever base portion and the second shaft in an opposite direction, the vertical movement of the cover member being converted into a straight line sliding action of the slide block and, at the same time, the contact parts are opened and closed by the said sliding action, each lead of the IC package that has been loaded on the upper block is receivable into a respective opened contact part of a contact element through the respective insertion hole, the inserted lead being held by the contact part when the contact part is closed by movement of the slide block.

6. A socket according to claim 4 in which the motion transfer member is a second shaft disposed a distance b from the first shaft and the distance a between the first shaft and the free distal end portion engageable with the cover member is significantly greater than b.

7. A socket according to claim 4 in which the upper block is formed with a cover guide frame comprising four upstanding, spaced guide members, the cover member slidably received over the guide members to accurately position the integrated circuit package receiving window relative to the lead insertion holes.

8. A socket according to claim 4 in which at least one of the contact pieces is formed with a generally L-shaped bend having an edge portion engageable with a lead received in a contact part to break through an oxide layer on the surface of the lead.

\* \* \* \* \*